(12) United States Patent
Chaturvedi et al.

(10) Patent No.: US 11,728,668 B2
(45) Date of Patent: Aug. 15, 2023

(54) ELECTRONIC DEVICE WITH BATTERY CAPABILITY MODELING

(71) Applicant: Apple Inc., Cupertino, CA (US)

(72) Inventors: Nalin Chaturvedi, Union City, CA (US); Yiming Lou, Cupertino, CA (US); Wei He, Sunnyvale, CA (US); Stephen D. Sterz, San Jose, CA (US)

(73) Assignee: Apple Inc., Cupertino, CA (US)

( * ) Notice: Subject to any disclaimer, the term of this patent is extended or adjusted under 35 U.S.C. 154(b) by 743 days.

(21) Appl. No.: 15/682,331

(22) Filed: Aug. 21, 2017

(65) Prior Publication Data

US 2018/0345812 A1 Dec. 6, 2018

Related U.S. Application Data

(60) Provisional application No. 62/514,562, filed on Jun. 2, 2017.

(51) Int. Cl.
| | |
|---|---|
| *G03B 7/16* | (2021.01) |
| *G03B 7/17* | (2021.01) |
| *H02J 7/00* | (2006.01) |
| *G01R 31/382* | (2019.01) |
| *G01R 31/392* | (2019.01) |

(Continued)

(52) U.S. Cl.
CPC ........ *H02J 7/007194* (2020.01); *B60L 58/10* (2019.02); *G01R 31/3647* (2019.01); *G01R 31/382* (2019.01); *G01R 31/392* (2019.01); *G03B 7/16* (2013.01); *G03B 7/17* (2015.01); *G06F 1/28* (2013.01); *G06F 1/3206* (2013.01); *H02J 7/00* (2013.01); *H02J 7/007* (2013.01); *H02J 7/00714* (2020.01);
(Continued)

(58) Field of Classification Search
CPC ..... B60L 11/1851; G01R 31/392; G03B 7/16; G03B 7/17
USPC ......................................... 702/63
See application file for complete search history.

(56) References Cited

U.S. PATENT DOCUMENTS

| | | | |
|---|---|---|---|
| 8,154,650 B2 * | 4/2012 | Tsai ................ | H04N 5/232945 348/371 |
| 8,258,748 B2 | 9/2012 | Constien et al. | |

(Continued)

*Primary Examiner* — Eman A Alkafawi
(74) *Attorney, Agent, or Firm* — Treyz Law Group, P.C.; Joseph F. Guihan; Tianyi He

(57) ABSTRACT

An electronic device may have a power system with a battery. The device may include power management circuitry that helps distribute power from the battery to components within the device. To prevent an excessive load from being applied to the battery and the battery from dropping below a cut-off voltage, power management circuitry may control power consumption by components in the device. Power consumption models in the power management circuitry may be used to ensure that maximum allowable power consumption levels are not exceeded. To help accurately and quickly manage power consumption decisions, each component may have characteristic power consumption values that characterize the power consumption profile of the component. These characteristic power consumption values may be provided to the power management circuitry with a request for power consumption and the power management circuitry may determine maximum allowable power consumption for the component based on the characteristic power consumption values.

14 Claims, 9 Drawing Sheets

(51) Int. Cl.
  *G01R 31/36* (2020.01)
  *G06F 1/28* (2006.01)
  *G06F 1/3206* (2019.01)
  *B60L 58/10* (2019.01)
  *H01M 10/48* (2006.01)
  *G01R 31/367* (2019.01)

(52) U.S. Cl.
  CPC ...... *H02J 7/007182* (2020.01); *G01R 31/367* (2019.01); *H01M 10/48* (2013.01); *H02J 7/00034* (2020.01)

(56) References Cited

U.S. PATENT DOCUMENTS

| | | |
|---|---|---|
| 8,504,817 B2 | 8/2013 | Jackson et al. |
| 9,369,964 B2 | 6/2016 | Panchal et al. |
| 2008/0263375 A1 | 10/2008 | Sundstrom et al. |
| 2012/0060024 A1* | 3/2012 | Jackson ................ G06F 1/3265 713/100 |
| 2013/0268257 A1* | 10/2013 | Hu ...................... G06F 17/5009 703/22 |
| 2013/0311117 A1* | 11/2013 | Chaturvedi ............. G06F 17/11 702/63 |
| 2014/0184896 A1* | 7/2014 | Imafuji .................... G03B 7/16 348/371 |
| 2015/0056947 A1* | 2/2015 | Panchai ............ H04W 52/0251 455/405 |
| 2015/0092103 A1* | 4/2015 | Lundgren .......... H04N 5/23241 348/371 |
| 2015/0316618 A1* | 11/2015 | Lou .................... G01R 31/3648 702/63 |
| 2016/0064986 A1* | 3/2016 | Langlinais ............. G06F 1/263 320/134 |
| 2016/0187949 A1 | 6/2016 | Sen |
| 2018/0004069 A1* | 1/2018 | Gammons ............ H04N 5/2256 |
| 2018/0279221 A1* | 9/2018 | Fuleshwar Prasad ...................... H04W 52/0216 |

\* cited by examiner $$I_b = \frac{-b_b + \sqrt{b_b^2 + 4a_b \cdot P_b}}{2a_b}$$

Where $a_b = F(\{R_i\}, t_b)$ $b_b = G(\{R_i\}, t_b, I_{ss}, OCV)$

*FIG. 7*

$$I_p = \frac{-b_b + \sqrt{b_p^2 + 4a_p \cdot P_p}}{2a_p}$$

Where $a_p = F(\{R_i\}, t_p)$ $b_p = G(\{R_i\}, t_p, I_b, t_b, OCV)$

*FIG. 8*

$$I_s = \frac{V_{gg} - b_s}{a_s}$$

Where $a_s = F(\{R_i\}, t_s)$ $b_s = G(\{R_i\}, t_s, I_p, t_p, OCV)$

*FIG. 9*

$P_s = V_{gg} \cdot I_s$

*FIG. 10*

ELECTRONIC DEVICE WITH BATTERY CAPABILITY MODELING

This application claims the benefit of provisional patent application No. 62/514,562, filed on Jun. 2, 2017, which is hereby incorporated by reference herein in its entirety.

BACKGROUND

This relates generally to electronic devices, and, more particularly, to power management in electronic devices.

Electronic devices such as cellular telephones have batteries. During operation, the electronic device may receive power (i.e., wired or wireless power) from chargers. The received power may be distributed to internal circuitry in the electronic device and/or to the battery of the electronic device. When the electronic device is not receiving power from a charger, the battery of the electronic device may provide power for internal circuitry in the electronic device.

If care is not taken, an excessive load may be placed on the battery during use. This may cause damage to the battery and reduce the lifetime of the battery.

SUMMARY

An electronic device such as a portable electronic device may have a power system with a battery. The electronic device may include power management circuitry that helps distribute power from the battery to components within the electronic device.

It is important to ensure that an excessive load is not applied to the battery in order to maintain a minimum usable voltage for the system and/or preserve battery health. To prevent an excessive load from being applied to the battery and the battery from dropping below a cut-off voltage, power management circuitry may monitor power consumption by components in the device. Power consumption models in the power management circuitry may be used to help ensure that maximum allowable power consumption levels are not exceeded. A component in the device may request authorization to use a certain levels of power. In response, the power management circuitry can determine the maximum allowable power consumption for the component and determine whether or not to authorize the request.

To help accurately and quickly manage power consumption decisions, each component may have characteristic power consumption values that characterize the power consumption profile of the component. These characteristic power consumption values may be provided to the power management circuitry with a request for power consumption and the power management circuitry may determine maximum allowable power consumption for the component based at least in part on the characteristic power consumption values.

BRIEF DESCRIPTION OF THE DRAWINGS

FIGS. 7-10 are illustrative equations that may be used in the method of FIG. 6 in accordance with an embodiment.

DETAILED DESCRIPTION

Electronic devices with batteries may include power management circuitry that helps distribute power from the battery to components within the electronic device. Power consumption models in the power management circuitry may be used to help ensure that maximum allowable power consumption levels are not exceeded. Components may request authorization to use certain levels of power. In response, the power management circuitry can determine the maximum allowable power consumption for the component and determine whether or not to authorize the request.

Figure 1:
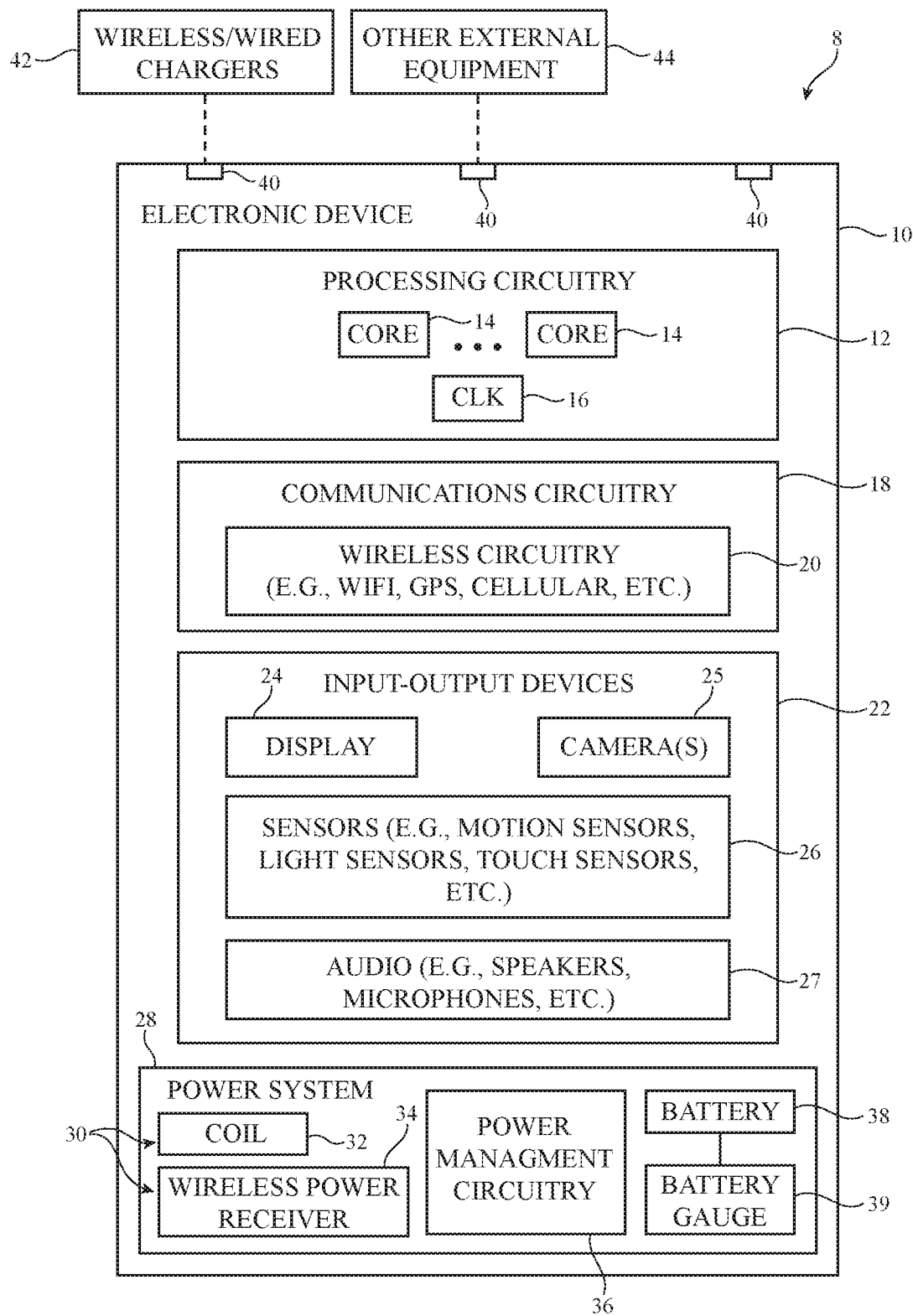
FIG. 1 is a schematic diagram of an illustrative system including an electronic device with a battery in accordance with an embodiment.

An illustrative system that includes an electronic device with a rechargeable battery is shown in FIG. 1. As shown in FIG. 1, system 8 includes electronic devices such as electronic device 10. Electronic device has battery 38. Electronic device 10 may be a cellular telephone, a computer (e.g., a tablet computer or laptop computer), a wristwatch device or other wearable equipment, and so forth. Illustrative configurations in which electronic device 10 is a portable electronic device may sometimes be described herein as an example.

As shown in FIG. 1, exemplary electronic device 10 has processing circuitry 12. Processing circuitry 12 may include processing circuitry associated with microprocessors, power management units, baseband processors, digital signal processors, microcontrollers, and/or application-specific integrated circuits with processing circuits. Processing circuitry 12 implements desired control and communications features in device 10. For example, processing circuitry 12 may be used in determining power transmission levels, processing sensor data, processing user input, and processing other information and using this information to adjust the operation of device 10. Processing circuitry may be used to authorize components to use power and ensure that components do not exceed maximum allowable power consumption levels. Processing circuitry 12 may be configured to perform these operations using hardware (e.g., dedicated hardware or circuitry), firmware and/or software. Software code for performing these operations is stored on non-transitory computer readable storage media (e.g., tangible computer readable storage media). The software code may sometimes be referred to as software, data, program instructions, instructions, or code. The non-transitory computer readable storage media may include non-volatile memory such as non-volatile random-access memory (NVRAM), one or more hard drives (e.g., magnetic drives or solid state drives), one or more removable flash drives or other removable media, or the like. Software stored on the non-transitory computer readable storage media may be executed on the processing circuitry of control circuitry 12. The processing circuitry may include application-specific integrated circuits with processing circuitry, one or more microprocessors, a central processing unit (CPU) or other processing circuitry.

Processing circuitry 12 may have adjustable hardware resources. For example, processing circuitry 12 may include multiple processing cores 14 that can be selectively switched into or out of use. Control circuitry 12 may also have clock circuitry such as clock circuitry 16. Clock circuitry 16 may supply an adjustable processor clock (e.g., a processor clock with a frequency that can be adjusted between a low frequency f1 to conserve power and a high frequency f2 to enhance processing speed). Clock circuitry 16 may also maintain information on the current time of day and date for device 10.

Device 10 has communications circuitry 18. Communications circuitry 18 may include wired communications circuitry (e.g., circuitry for transmitting and/or receiving digital and/or analog signals via a port associated with a connector 40) and may include wireless communications circuitry 20 (e.g., radio-frequency transceivers and antennas) for supporting communications with wireless equipment. Wireless communications circuitry 20 may include wireless local area network circuitry (e.g., WiFi® circuitry), cellular telephone transceiver circuitry, satellite positioning system receiver circuitry (e.g., a Global Positioning System receiver for determining location, velocity, etc.), near-field communications circuitry and/or other wireless communications circuitry.

Device 10 uses input-output devices 22 to receive input from a user and the operating environment of device 10 and to provide output. Input-output devices 22 may include one or more visual output devices such as display 24 (e.g., a liquid crystal display, an organic light-emitting diode display, or other display). Display 24 may be a touch-sensitive display. Input-output devices 22 include one or more sensors for receiving input from a user or determining the operating environment of the device. Sensors 26 in input-output devices 22 may include force sensors, touch sensors, capacitive proximity sensors, optical proximity sensors, ambient light sensors, temperature sensors, air pressure sensors, gas sensors, particulate sensors, magnetic sensors, motion and orientation sensors (e.g., inertial measurement units based on one or more sensors such as accelerometer, gyroscopes, and magnetometers), strain gauges, etc. Input-output devices 22 may include one or more cameras 25 for capturing images. Device 10 may have a front-facing camera and a rear-facing camera, as an example. Each camera in device 10 may have a corresponding camera flash for illuminating the imaged scene. Input-output devices 22 may include audio input-output devices 27 such as speakers and microphones used to capture audio input and generate audio for the user. Input-output devices 22 may also include buttons, joysticks, scrolling wheels, touch pads, key pads, keyboards, tone generators, vibrators (e.g., piezoelectric vibrating components, etc.), light-emitting diodes and other status indicators, data ports, etc.

Electronic device 10 may interact with equipment such as charging system 42 (sometimes referred to as a charging mat, charging puck, power adapter, etc.). Electronic device 10 may also interact with other external equipment 44 (e.g., an accessory battery case, earphones, network equipment, etc.). Charging system 42 may include wired power circuitry and/or wireless power circuitry. For example, charging system 42 may include a wired power source that provides direct-current power to device 10 from a mains power supply (e.g., system 42 may include an alternating-current-to-direct current adapter, etc.). Direct-current power may also be supplied to device 10 from a battery case or other external equipment 44 plugged into a port associated with a connector such as one of connectors 40 in device 10 or other equipment for supplying power such as direct-current power over a cable or other wired link coupled to connector 40. If desired, charging system 42 may include wireless power transmitting circuitry for supplying wireless power to electronic device 10. Wireless power transmitting circuitry in system 42 may, for example, include an oscillator and inverter circuitry that drives a signal into a coil and thereby causes the coil to produce electromagnetic fields that are received by a corresponding coil in device 10 (see, e.g., coil 32 and associated wireless power receiver 34 in wireless power receiver circuitry 30). Configurations in which wireless power is transmitted using capacitive coupling arrangements, near-field wireless power transmissions, and/or other wireless power arrangements may also be used. The use of an inductive wireless power arrangement in which system 42 and device 10 support inductive power transfer is merely illustrative.

Using communications circuitry 18, device 10 can communicate with external equipment such as equipment 44. Equipment 44 may include accessories that can be communicatively coupled to device 10 (e.g., ear buds, covers, keyboards, mice, displays, etc.), may include wireless local area network equipment and/or other computing equipment that interacts with device 10, may include peer devices (e.g., other devices such as device 10), may include covers, cases, and other accessories with optional supplemental batteries, and/or may include other electronic equipment.

Device 10 includes power circuitry such as power system 28. Power system 28 includes a battery such as battery 38. Battery 38 of device 10 may be used to power device 10 when device 10 is not receiving wired or wireless power from another source. In some configurations, device 10 may use battery power associated with an accessory (e.g., external equipment 44). In other configurations, battery 38 of device 10 may be used to supply power to external equipment 44. System 42 may also power device 10 using wired or wireless power.

Power system 28 may be used in receiving wired power from an external source (e.g., system 42 or a battery case) and/or may include wireless power receiving circuitry 30 for receiving wirelessly transmitted power from a corresponding wireless power transmitting circuit in system 42. Wireless power receiving circuitry 30 may, as an example, include a coil such as coil 32 and an associated wireless power receiver 34 (e.g., a rectifier). During operation, coil 32 may receive wirelessly transmitted power signals and wireless power receiver 34 may convert these received signals into direct-current power for device 10. Power management circuitry 36 may be used in managing the power in power system 28. Power management circuitry may be formed as a part of the central processing unit (CPU) for device 10. Alternatively, power management circuitry 36 may be formed from one or more power management unit (PMU) integrated circuits (i.e., formed separately from the central processing unit). In either scenario, power management circuitry 36 may be considered processing circuitry (i.e., part of processing circuitry 12 in FIG. 1). During operation, power management circuitry 36 distributes received power (i.e., wired or wireless power from chargers 42) to internal circuitry in device 10 and/or to battery 38 (e.g., to charge battery 38). Power management circuitry 36 also distributes power from battery 38 to internal circuitry in device 10 or to external equipment such as external equipment 44.

Battery gauge 39 in power system 28 obtains measurements from battery 38 in order to determine properties of the battery in real time. For example, battery gauge 39 may include a voltage sensor (sometimes referred to as a voltmeter) that is configured to measure a voltage associated with the battery, a current sensor (sometimes referred to as an ammeter) that is configured to measure a current associated with the battery, and a temperature sensor that is configured to measure a temperature associated with the battery. Battery gauge 39 may use these sensors to determine properties of the battery. For example, the voltage sensor may determine the voltage of the battery. The voltage of the battery may be used to help determine a state of charge (SOC) of the battery (i.e., an assessment of the battery charge level as a percentage). The current sensor may measure a load applied to the battery (i.e., current drawn to operate components in the electronic device). The temperature sensor may measure a temperature associated with the battery. One or more temperature sensors may be formed in the interior of the electronic device, in a thermally isolated region of the electronic device, on the exterior of the electronic device, or other desired locations. Temperature sensors on the exterior of the device may measure environmental conditions of the electronic device. Temperature sensors in the interior of the electronic device may measure the temperature of the battery itself. Multiple temperature sensors may be included to account for situations in which the temperature of the battery is non-uniform (i.e., the battery has temperature gradients or hotspots).

Information from the battery gauge is used by electronic device 10 (i.e., by control circuitry such as power management circuitry 36) to determine maximum allowable power consumption information. The maximum allowable power consumption information is used to distribute power from battery 38 to other components in electronic device 10. Because battery 38 has a finite amount of power to be distributed through electronic device 10, each component may only receive a limited amount of power. In some cases, a component may require additional power to perform a particular task. In order to ensure that an excessive load is not applied to the battery, processing circuitry (e.g., power management circuitry 36) determines if there is enough available power to allow a component to perform a task. For example, power management circuitry 36 may receive a request from a component to use a particular amount of power. Based on the conditions of the battery (i.e., from battery gauge 39), power management circuitry 36 may determine if there is enough available power for the component to receive the requested power. Power management circuitry may ensure that battery 38 does not drop below its cut-off voltage ($V_{gg}$). The cut-off voltage is the voltage at which battery 38 is considered fully discharged (as any further discharge may cause the voltage to drop below the minimum usable voltage for the system and/or damage the battery).

Figure 2:
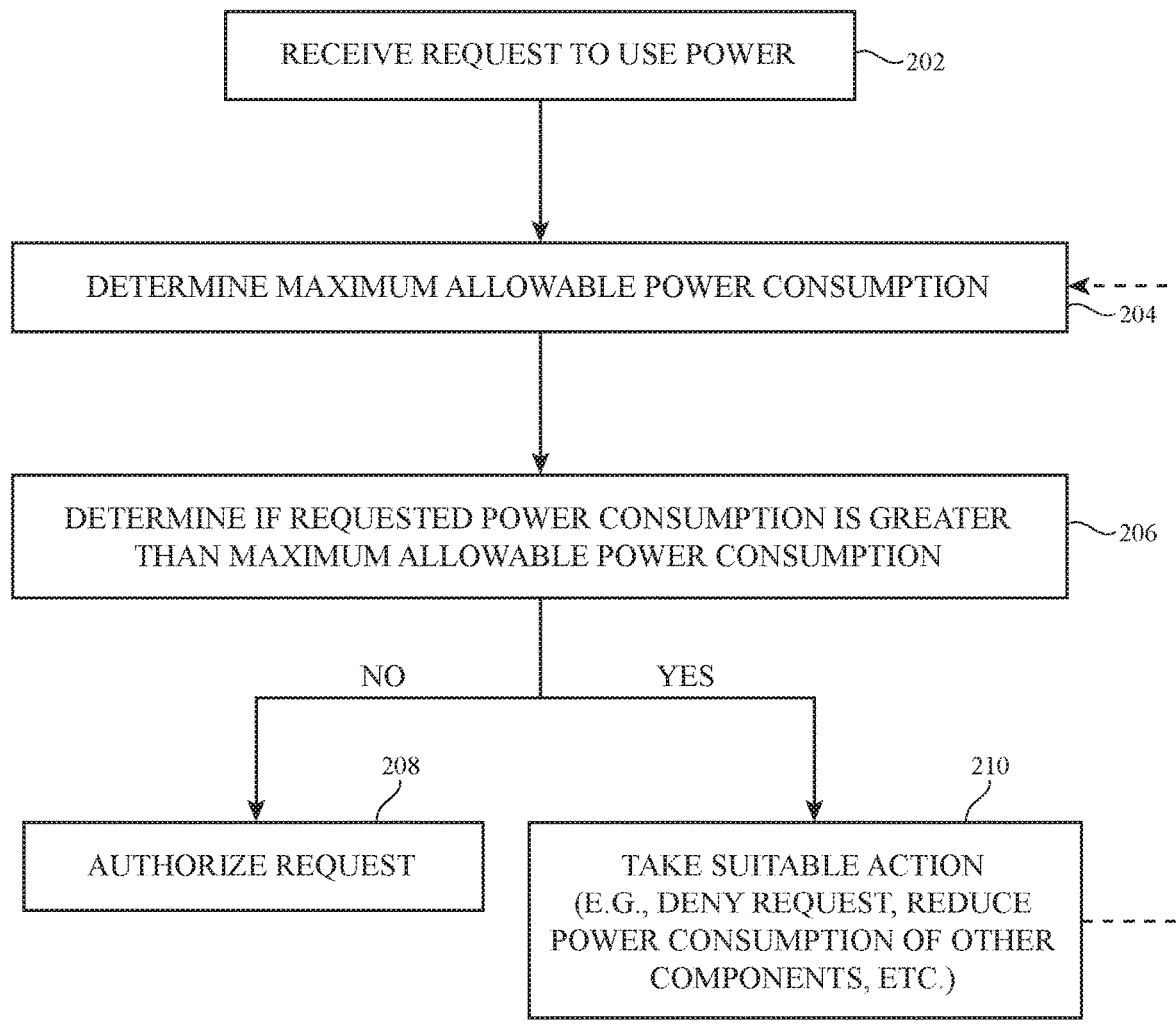
FIG. 2 is a flowchart of illustrative steps that may be performed to control power consumption of components in an electronic device in accordance with an embodiment.

FIG. 2 is a flowchart showing illustrative method steps for power management in an electronic device. These steps may be performed by, for example, power management circuitry 36. As shown, at step 202 power management circuitry 36 receives a request to use power from a component. The requests to use power received by power management circuitry 36 may be generated by anything in electronic device 10 that consumes power, including both hardware and software. For simplicity, the term "component" hereinafter may refer to anything in system 8 that consumes power (including both hardware and software). The possible requests to consume power in electronic device 10 are wide-ranging. As a few non-limiting examples, a camera module may request to use power in a light source for a camera flash, a speaker may request to use power to play audio, a display may request to use power to increase brightness of the display, communications circuitry may request to use power to transmit wireless communication signals (e.g., with a radio-frequency transceiver), a sensor may request to use power to obtain sensor data, or an application program (app) may request to use power for increased processing speeds.

At step 204, after receiving the request to use power, power management circuitry 36 determines a maximum allowable power consumption for the component making the request. To determine maximum allowable power consumption, power management circuitry 36 uses information from the battery gauge regarding the state of the battery and the load being applied to the battery. Power management circuitry 36 may use modeling techniques to model the power consumption characteristics of the requesting component and assess how much power the component can be allotted.

After determining the maximum allowable power consumption for the component, the requested power consumption may be compared to the maximum allowable power consumption at step 206. If the requested power consumption is not greater than the maximum allowable power consumption (i.e., the requested power consumption is less than the maximum allowable power consumption), then the request for power consumption is authorized at step 208. In other words, if there is enough available power for the component to operate with the increased power consumption, the request for increased power consumption is authorized. If the requested power consumption is greater than the maximum allowable power consumption, then one or more other suitable actions are taken at step 210. In other words, if there is not enough available power to honor the component's request for increased power consumption, one or more other suitable actions are taken.

Numerous actions may be taken at step 210. In some cases, the request for increased power consumption may simply be denied (and no further actions may be taken). However, in some cases (i.e., when necessary for the user experience), actions may be taken to accommodate the requested increase in power consumption. Take an example where the received request is a request for increased power to use a flash for capturing an image with a camera in the electronic device. In this case, the user's experience will be directly affected if the flash is not allowed to operate. Accordingly, to accommodate the request, the power consumption of other components may be reduced at step 210 to allow increased power resources to be devoted to the flash. In some embodiments, the request for increased power consumption may be automatically authorized after reducing the power consumption of other components. Alternatively, after reducing the power consumption of other components at step 210, the method may return to step 204. The maximum allowable power consumption may be determined again (with the new conditions imposed at step 210) and the method may be repeated.

Requests that are accommodated at step 210 (i.e., by reducing power in other areas) may tend to be for actions that will directly affect the user experience. In contrast, requests that are denied (without further action) at step 210 may tend to be for actions that will not affect the user experience. For example, requests to take a picture or play audio may be high priority requests that will be accommodated at step 210. A request for increased power consumption for tasks such as background processing may be denied without further action at step 210. Along these lines, if the power consumption of other components is reduced at step 210 to accommodate the original power consumption request, care may be taken to ensure that reducing the power consumption of the other components does not affect the user experience. For example, power being used for background processing may be reduced.

To help manage the distribution of power throughout electronic device 10, it would be desirable if the precise power consumption profile of each component was known by the power management circuitry. For example, the power consumption of a component may be monitored over an extended period of time to generate a power consumption profile. However, capturing the power consumption profile of the component in a concise way can be difficult. In one embodiment, the maximum possible power consumption may be used to characterize the power consumption profile of the component. However, this single value may be misleading. For example, a first component may have relatively low power consumption most of the time and occasionally spike to a relatively high power consumption. A second component may stay at the relatively high power consumption level all of the time. These two components may be characterized in the same way by maximum possible power consumption, even though one of the components requires much more power over time. Similarly, in another embodiment, average power consumption may be used to characterize the power consumption profile. However, average power consumption provides no information regarding the variance from the average power consumption over time (i.e., a first component may stay at approximately a constant level of power consumption while a second component may exhibit great variance from the average power consumption).

Figure 3:
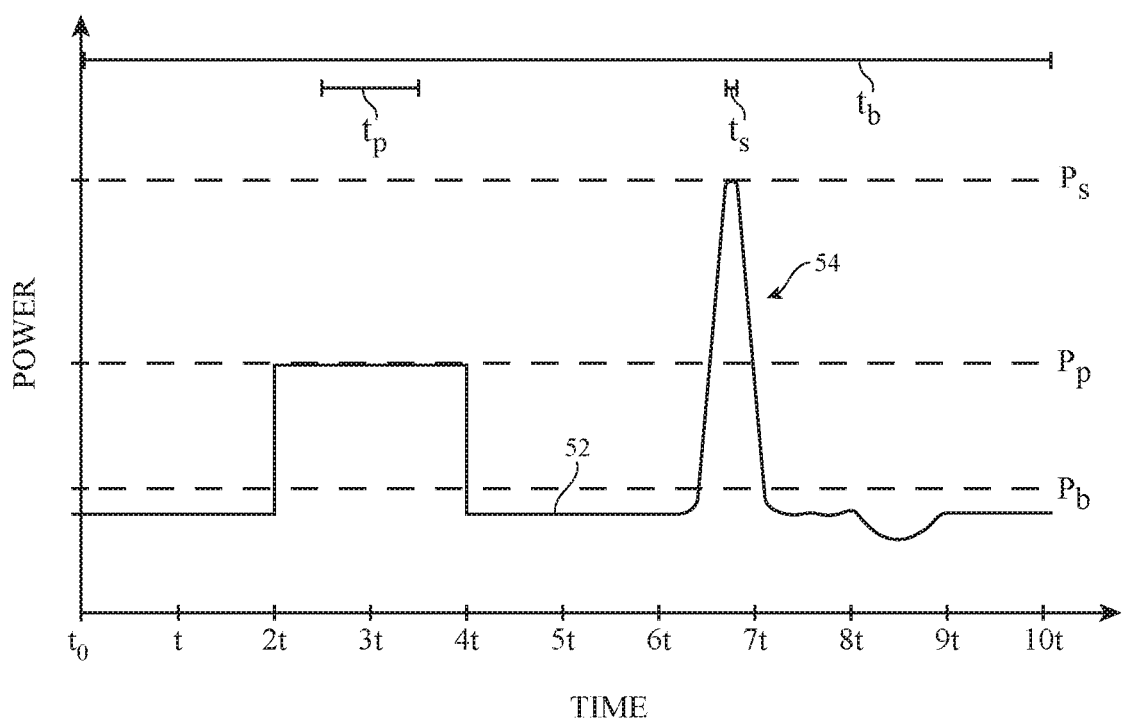
FIG. 3 is a graph of an illustrative power consumption profile with characteristic power consumption values and associated time intervals in accordance with an embodiment.

In order to enable a more nuanced assessment of power consumption by components, requested increases in power consumption, and maximum allowable power consumptions, components that consume power in electronic device 10 may have characteristic power consumption values. The characteristic power consumption values help characterize the power consumption profile of the component over time. Illustrative characteristic power consumption values are shown in FIG. 3. FIG. 3 shows a power consumption profile 52 for a component in electronic device 10. The power consumption profile reflects power consumption over time for the component. As shown, the power consumed by the component may increase or decrease over time.

In order to characterize the power consumption profile, characteristic power consumption values $P_S$, $P_P$, and $P_b$ are determined. $P_S$, $P_P$, and $P_b$ (sometimes written $P_{SPIKE}$, $P_{PULSE}$, and $P_{BASE}$) represent "spike power," "pulse power," and "base power," respectively. Each characteristic power consumption value is an assessment of power requirements over a different length of time. For example, $P_b$ is associated with a first length of time $t_b$, $P_p$ is associated with a second length of time $t_p$, and $P_s$ is associated with a third length of time $t_s$. The characteristic power consumption values may be proportional to maximum average power consumption over the associated length of time. In the example of FIG. 3, the x-axis shows progressive intervals of time t. The length of time associated with $P_b$ (i.e., $t_b$) may be 10 t, the length of time associated with $P_p$ (i.e., $t_p$) may be 1 t, and the length of time associated with $P_s$ (i.e., $t_S$) may be 0.1 t.

$P_b$ may be proportional to the highest average power consumption of the power consumption profile over $t_b$. In other words, the average of each 10 t interval of power consumption profile 52 may be examined. $P_b$ may be proportional to the highest of these averages. As shown in FIG. 3, the length of time $t_b$ is long enough to capture both dips and spikes in the power consumption. The resulting $P_b$ value (as shown in FIG. 3) is therefore significantly less than the maximum power consumption (during spike event 54). In some cases, the power consumption during spike event 54 may even be discarded when determining $P_b$. $P_p$ may be proportional to the highest average power consumption of the power consumption profile over $t_p$. In other words, the average of each 1 t interval of power consumption profile 52 may be examined. $P_p$ may be proportional to the highest of these averages. In some cases, the power consumption during spike event 54 may be discarded when determining $P_p$. As shown in FIG. 3, the resulting $P_p$ value is greater than the $P_b$ value. $P_s$ may be proportional to the highest average power consumption of the power consumption profile over $t_s$. In other words, the average of each 0.1 t interval of power consumption profile 52 may be examined. $P_s$ may be proportional to the highest of these averages. As shown in FIG. 3, because the length of time $t_s$ is so short, the power consumption of spike event 54 may fill the entire length of time $t_s$ without any lower power consumption to offset the spike in power consumption. The resulting $P_s$ value is therefore greater than the $P_p$ value and may be approximately equal to the maximum power consumption during spike event 54.

The examples of time intervals used above are merely illustrative. In general, each characteristic power consumption value may have any desired associated time interval. However, in order to maximize the amount of information conveyed by the characteristic power consumption values, the time intervals associated with each characteristic power consumption value may vary by an order of magnitude. For example, $t_s$ may be 1 milliseconds (ms), $t_p$ may be 10 ms, and $t_b$ may be 100 ms. In another example, $t_s$ is 0.1 seconds, $t_p$ is 1 second, and $t_b$ is 10 seconds. In general, the relationship of 100 $t_S$=10 $t_p$=1 $t_b$ may hold true for the selected time intervals. Stated another way, each time interval may differ from its adjacent time intervals by approximately a factor of 10. This example is merely illustrative, however, and other factors may be used if desired. For example, each time interval may differ from its adjacent time intervals by a factor of between 8 and 12, a factor between 9 and 11, a factor between 5 and 15, a factor less than 15, a factor greater than 5, or any other desired factor.

Additionally, the example of three characteristic power consumption values being used is merely illustrative. Any desired number of characteristic power consumption values can be used to characterize a power consumption profile. However, the relationship between associated time intervals of each characteristic power consumption value may hold as more or less characteristic power consumption values are used. In general there may be "n" number of characteristic power consumption values $P_1$, $P_2$, $P_3$, . . . , $P_n$ with corresponding time intervals $t_1$, $t_2$, $t_3$, . . . , $t_n$ where $t_n = t*10^{n-1}$ and t is selected based on the time frames of interest. A different factor may be used instead of 10 as discussed above if desired (i.e., $t_n = t*x^{n-1}$ where "x" is the chosen scaling factor).

Revisiting FIG. 2, power management circuitry 36 may use characteristic power consumption values when determining maximum allowable power consumption. For example, at step 202, when receiving a request to use power from a component, at least one characteristic power consumption value may be included with the request. In one scenario, the component's base power $P_b$ and pulse power $P_p$ (and corresponding time intervals $t_b$ and $t_p$) are included with the request. The request may also include an additional time interval $i_s$ for spike power and a requested spike power value. The determined maximum allowable power consumption may then be the maximum allowable power consumption spike (i.e., the max $P_s$) over time interval $t_s$. At step 204, maximum allowable power consumption is determined based at least in part on the characteristic power consumption values provided by the requesting component. Then, at step 206, the maximum allowable spike power may be compared to the requested spike power value from the component. Steps used to determine maximum allowable power consumption will be examined in FIGS. 4-6.

Figure 4:
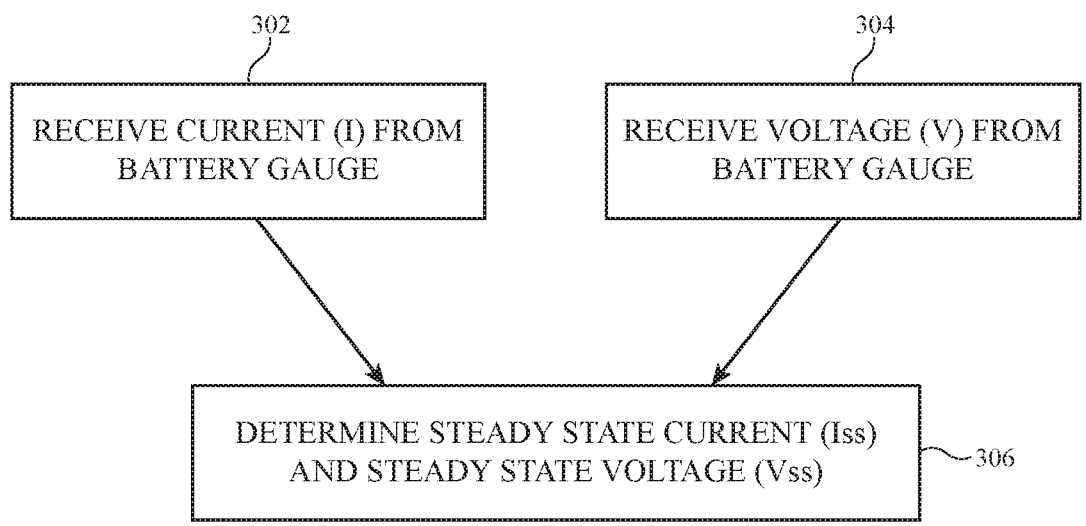
FIG. 4 is a flowchart of illustrative steps that may be performed by power management circuitry to determine steady state current ($I_{SS}$) and steady state voltage ($V_{SS}$) in accordance with an embodiment.

FIG. 4 shows an illustrative method performed during step 204 of FIG. 2. As shown, at step 302, power management circuitry 36 receives a current value (I) from a current sensor in battery gauge 39. At step 304, power management circuitry 36 receives a voltage value (V) from battery gauge 39. Next, based at least on the current (I) and the voltage (V), power management circuitry 36 determines a steady state current value ($I_{SS}$) and a steady state voltage value ($V_{SS}$). The steady state current value and steady state voltage value may subsequently be used to help determine a maximum allowable power consumption for a component.

Figure 5:
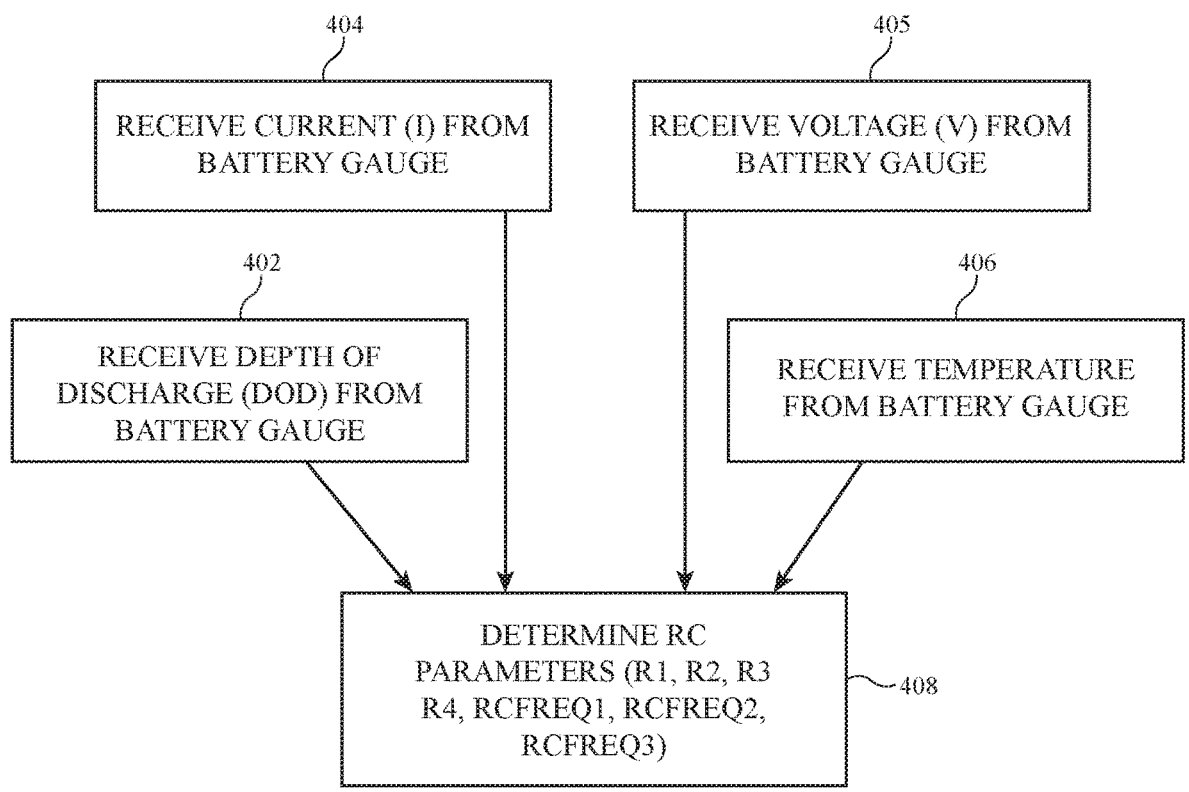
FIG. 5 is a flowchart of illustrative steps that may be performed by power management circuitry to determine RC parameters in accordance with an embodiment.

FIG. 5 shows an illustrative method performed during step 204 of FIG. 2. As shown, at step 402 power management circuitry receives the depth of discharge (DOD) from the battery gauge. The depth of discharge is equivalent to 1—state of charge (SOC). For example, if the state of charge of the battery is 85%, the depth of discharge is 15%. At step 404, the power management circuitry receives a current value (I) from the battery gauge. At step 405, the power management circuitry receives a voltage (V) from the battery gauge. At step 406, the power management circuitry receives a temperature from the battery gauge. At step 408, the power management circuitry determines RC parameters based on at least one of the received depth of discharge, current, voltage, and temperature values. The RC parameters may be based on an n-th order equivalent circuit model of a battery (i.e., an n-RC model). RC parameters may include R1, R2, R3, R4, $RC_{FREQ1}$, $RC_{FREQ2}$, and $RC_{FREQ3}$. The RC parameters may subsequently be used to help determine a maximum allowable power consumption for a component.

Figure 6:
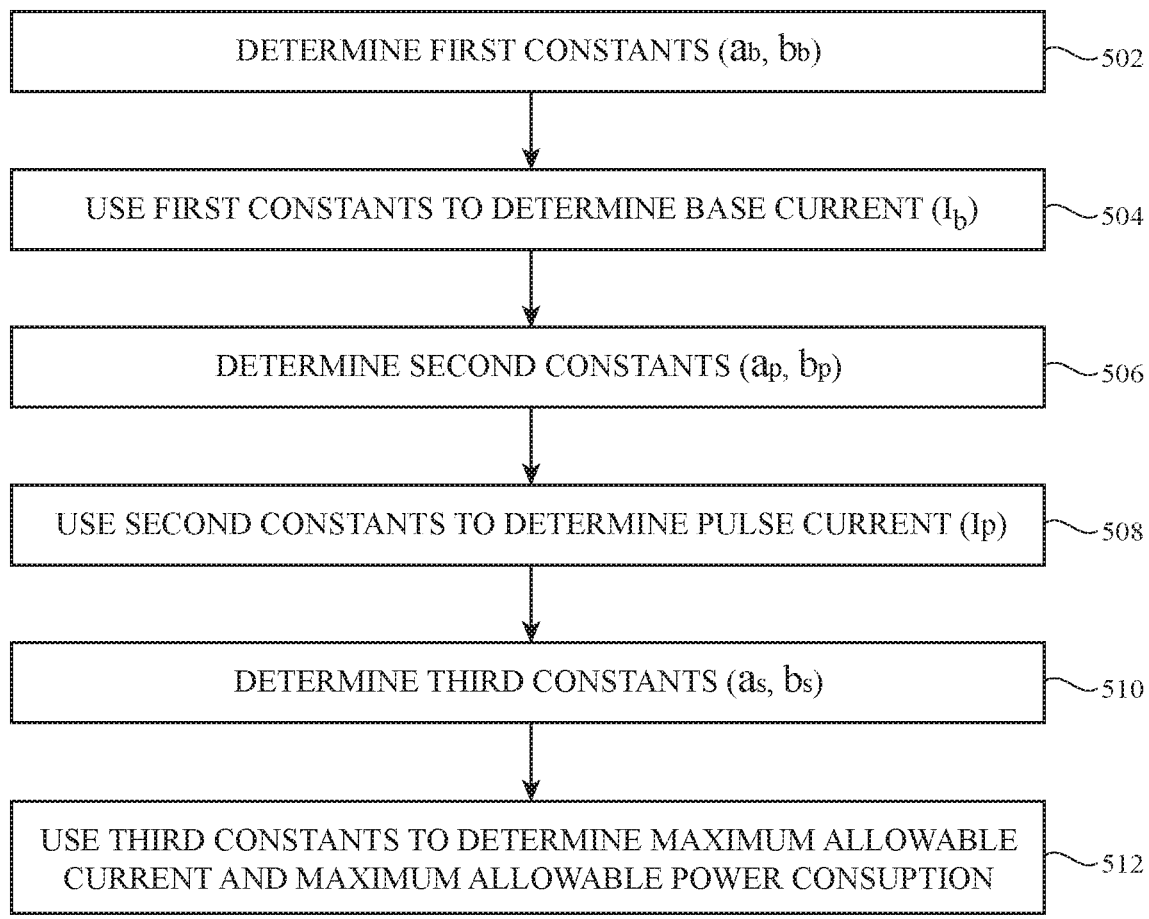
FIG. 6 is a flowchart of illustrative steps that may be performed by power management circuitry to determine the maximum allowable power consumption for a component in accordance with an embodiment.

FIG. 6 shows an illustrative method performed during step 204 of FIG. 2. FIG. 6 shows the primary method for determining maximum allowable power consumption for a component. First, at step 502, a first set of constants ($a_b$, $b_b$), sometimes referred to as maximum allowable power consumption constants, are determined. Constant $a_b$ is a function of the RC parameters (i.e., the RC parameters determined a step 408 of FIG. 5) and the time interval $t_b$ associated with base power $P_b$. Constant $b_b$ is a function of the RC parameters ($\{R_i\}$), $t_b$, steady state current ($I_{SS}$), and open-circuit voltage (OCV). Open-circuit voltage is a function of the depth of discharge (DOD) of the battery. Next, at step 504, the first constants ($a_b$ and $b_b$) are used to determine base current ($I_b$). The equation of FIG. 7 shows base current ($I_b$) as a function of constant $a_b$, constant $b_b$, and the known characteristic power consumption value $P_b$ provided by the component.

After determining base current ($I_b$) in step 504, second constants $a_p$ and $b_p$ (sometimes referred to as maximum allowable power consumption constants) are determined at step 506. Constant $a_p$ is a function of the RC parameters and the time interval $t_p$ associated with pulse power $P_p$. Constant $b_p$ is a function of the RC parameters ($\{R_i\}$), $t_p$, base current ($I_b$), $t_b$, and open-circuit voltage (OCV). Next, at step 508, the second constants ($a_p$ and $b_p$) are used to determine pulse current ($I_p$). The equation of FIG. 8 shows pulse current ($I_p$) as a function of constant $a_p$, constant $b_p$, and the known characteristic power consumption value $P_p$ provided by the component.

After determining pulse current ($I_p$) in step 508, third constants $a_s$ and $b_s$ (sometimes referred to as maximum allowable power consumption constants) are determined at step 510. Constant $a_s$ is a function of the RC parameters and the time interval $t_s$ associated with pulse power $P_s$. Constant $b_s$ is a function of the RC parameters ($\{R_i\}$), $t_s$, pulse current ($I_p$), $t_p$, and open-circuit voltage (OCV). Next, at step 512, the third constants ($a_s$ and $b_s$) are used to determine spike current ($I_s$). This spike current ($I_s$) is the maximum allowable spike current for the component. The equation of FIG. 9 shows spike current ($I_s$) as a function of constant $a_s$, constant $b_s$, and cut-off voltage ($V_{gg}$). The cut-off voltage is the lowest allowable voltage for the battery. The calculated spike current ($I_s$) is the maximum allowable current for the component that is requesting to use power. The maximum allowable power consumption can then be determined by multiplying the maximum allowable current ($I_s$) by the cut-off voltage ($V_{gg}$) as shown in the equation of FIG. 10. The final result of this method ($P_s$) may be the maximum allowable spike power for the component. Said another way, the final result of this method may be the maximum allowable power consumption over the given time interval $t_s$. In subsequent steps, power management circuitry 36 may compare the calculated maximum allowable spike power to the requested spike power from the component.

Figure 11:
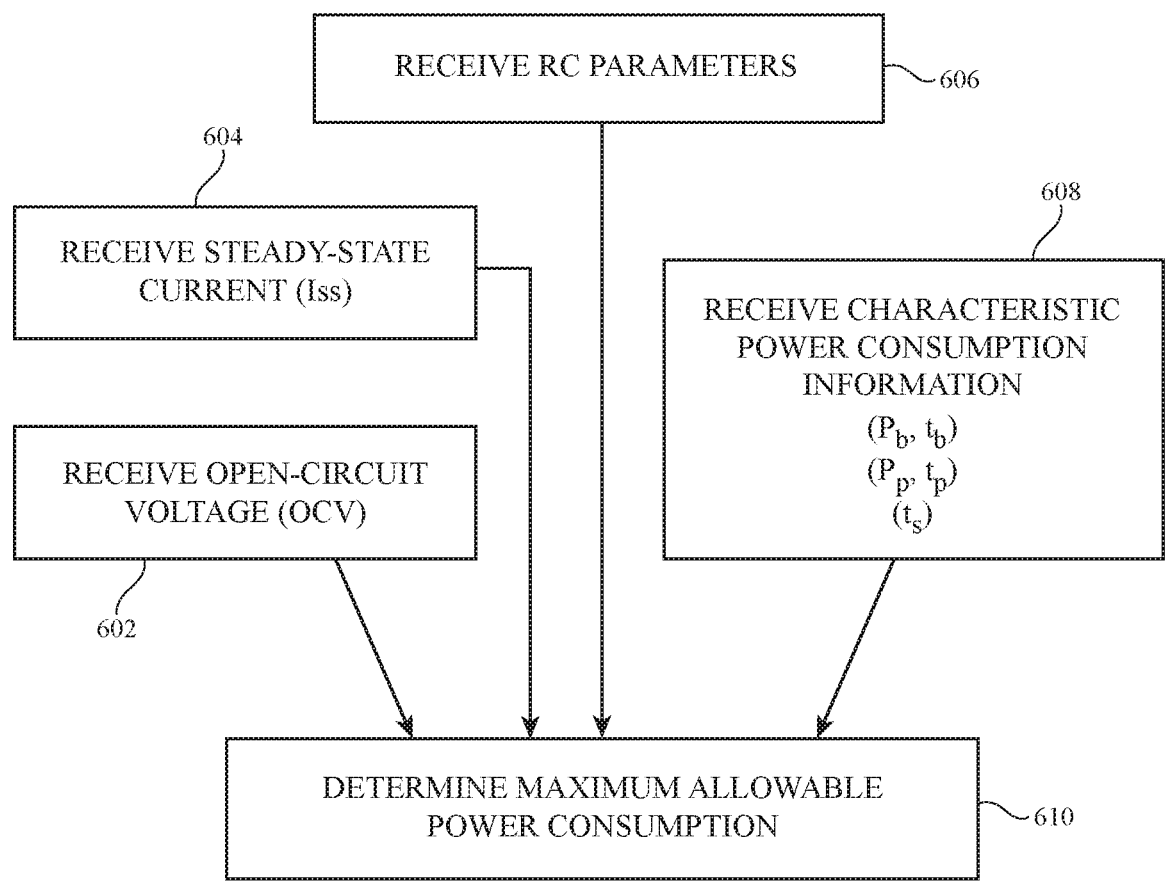
FIG. 11 is a flowchart of illustrative operations that may be performed by power management circuitry to determine the maximum allowable power consumption for a component in accordance with an embodiment.

FIG. 11 shows an overview of the method of FIG. 6. As shown, in order to determine maximum allowable power consumption, power management circuitry 36 determines an open-circuit voltage (OCV) value. The open-circuit voltage value may be determined as a function of depth of discharge (DOD) which is received from the battery gauge. Next, at step 604 the steady state current ($I_{SS}$) is received. The steady state current value may be determined by power management circuit 36 in an earlier method (i.e., step 306 of FIG. 4). At step 606 the RC parameters are received. The RC parameters may be determined by power management circuitry 36 in an earlier method (i.e., step 408 of FIG. 5). At step 608, characteristic power consumption information may be received from the component making the request for power consumption. As shown, a base power and corresponding time interval ($P_b$, $t_b$), a pulse power and corresponding time interval ($P_p$, $t_p$) and a time interval ($t_s$) associated with spike power may be provided. A requested spike power value may also be included in the request. At step 610 the information is used to determine maximum allowable power consumption (e.g., maximum allowable spike power $P_s$ corresponding to time interval $t_s$).

In the aforementioned example of FIG. 11, a component that is requesting to use power has two fixed characteristic power consumption values with corresponding fixed time intervals. The component also provides a third time interval. The power management circuitry determines a third characteristic power consumption value associated with the third time interval that represents the maximum allowable power consumption for the component over the third time interval. In FIG. 11, the base power ($P_b$) and pulse power ($P_p$) are known and the spike power $P_s$ is unknown. However, this example is merely illustrative. In some cases, the component requesting an increase in power consumption may include the base power or the pulse power as the unknown portion of the characteristic power consumption information. In these scenarios, the power management circuitry may still determine the maximum allowable power consumption for the unknown portion of the characteristic power consumption information.

Take an example in which a component provides a known spike power ($P_s$) and pulse power ($P_s$). The power management circuitry may determine a maximum allowable base power ($P_b$) for the component. To achieve this, the same formulas may be used as described in FIG. 6 and associated FIGS. 7-10. Because $P_b$ is unknown, a value for $P_b$ is guessed at the beginning of the method shown in FIG. 6. This predicted $P_b$ value is used to calculate the maximum allowable spike power $P_s$. If the spike power $P_s$ calculated with the predicted $P_b$ matches the value for spike power provided by the component, then the predicted $P_b$ value is correct. If the spike power $P_s$ calculated with the predicted $P_b$ does not match the value for spike power provided by the component, then the $P_b$ prediction is incorrect and the prediction is updated. Additional iterations of the process may be performed until the calculated $P_s$ matches the $P_s$ given by the component. This type of process may be implemented similarly when $P_p$ is unknown (and $P_s$ and $P_b$ are known).

Figure 12:
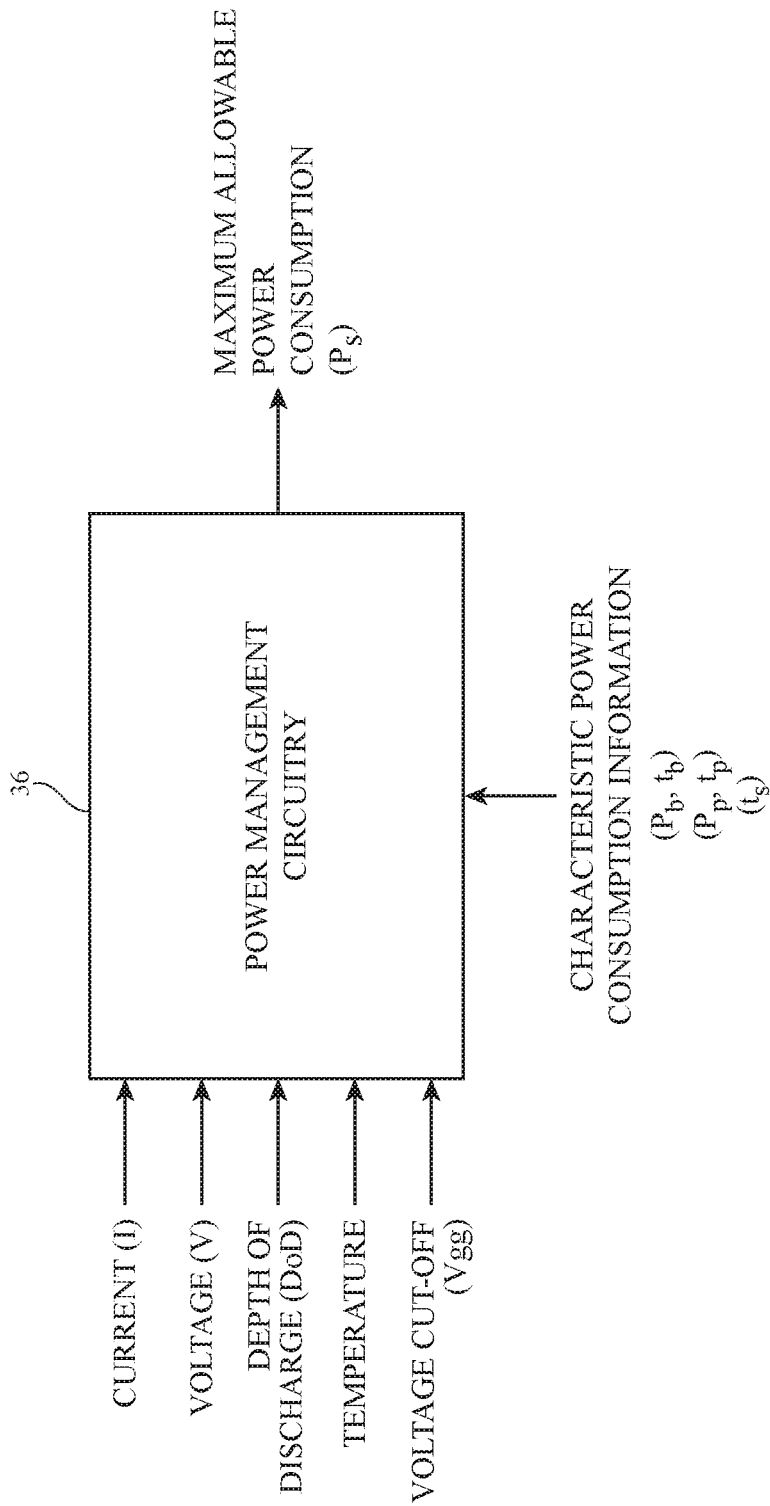
FIG. 12 is a schematic diagram showing power management circuitry generating maximum allowable power consumption information based on various inputs in accordance with an embodiment.

FIG. 12 is a schematic diagram of power management circuitry 36 generating maximum allowable power consumption information. As shown, power management circuitry 36 receives information regarding the battery from battery gauge 39 such as current (I), voltage (V), depth of discharge (DOD), and temperature. Power management circuitry 36 may also have a voltage cut-off ($V_{gg}$). Finally, power management circuitry receives characteristic power consumption information from a component in the electronic device. With all of this information, power management circuitry 36 determines a maximum allowable power consumption value. The maximum allowable power consumption value can be used to assess and take action in response to the request for power consumption from the component.

The foregoing is merely illustrative and various modifications can be made to the described embodiments. The foregoing embodiments may be implemented individually or in any combination.

What is claimed is:

1. An electronic device comprising:
a battery;
a component that operates by receiving power from the battery and that has a power consumption profile, the power consumption profile having a first characteristic power consumption value that is associated with power consumption across a first time period and having a second characteristic power consumption value that is associated with power consumption across a second time period, wherein the second characteristic power consumption value is greater than the first characteristic power consumption value and the first time period overlaps the second time period; and
processing circuitry configured to:
receive a power usage request for the component with a requested third characteristic power consumption value,
determine a maximum allowable power consumption for the component based at least on the first and second characteristic power consumption values,
compare the maximum allowable power consumption to the requested third characteristic power consumption value, and
authorize the power usage request for the component in response to determining that the maximum allowable power consumption is greater than the requested third characteristic power consumption value.

2. The electronic device of claim 1, wherein the processing circuitry is further configured to deny the power usage request for the component in response to determining that the maximum allowable power consumption is less than the requested third characteristic power consumption value.

3. The electronic device of claim 1, wherein the first time period has a first length of time, and the second time period has a second length of time that is shorter than the first length of time.

4. The electronic device of claim 3, further comprising a battery gauge configured to identify a current, a voltage, a temperature, and a depth of discharge associated with the battery, wherein the processing circuitry is configured to determine a steady state current based on the current and the voltage and determine RC parameters based on at least two properties from the group consisting of the current, the depth of discharge, and the temperature.

5. The electronic device of claim 4, wherein the processing circuitry is configured to:
determine a first set of maximum allowable power consumption constants based on the RC parameters, the first length of time, the steady state current, and an open-circuit voltage;
determine a first current value based on the first set of maximum allowable power consumption constants and the first characteristic power consumption value;
determine a second set of maximum allowable power consumption constants based on the RC parameters, the second length of time, the first current value, the first length of time, and the open-circuit voltage;
determine a second current value based on the second set of maximum allowable power consumption constants and the second characteristic power consumption value;
determine a third set of maximum allowable power consumption constants based on the RC parameters, a third length of time, the second current value, the second length of time, and the open-circuit voltage;
determine a third current value based on the third set of maximum allowable power consumption constants and a cut-off voltage; and
determine the maximum allowable power consumption based on the third current value and the cut-off voltage.

6. The electronic device of claim 1, wherein the component is a hardware component selected from the group consisting of: a display, a camera, a motion sensor, a light sensor, a touch sensor, a speaker, a microphone, and a radio-frequency transceiver.

7. The electronic device of claim 1, wherein the first characteristic power consumption value is associated with an average power consumption of the component over the first time period and the second characteristic power consumption value is associated with an average power consumption of the component over the second time period, the first time period being at least five times longer than the second time period.

8. An electronic device comprising:
a battery;
a battery gauge that measures at least one property associated with the battery;

a component that requires power to operate and exhibits at least first and second characteristic power consumption values, wherein the first characteristic power consumption value characterizes power consumption of the component across a time period using a first set of time intervals, and wherein the second characteristic power consumption value characterizes power consumption of the component across the time period using a second set of time intervals that is different than the first set of time intervals; and processing circuitry configured to:
    receive a request to increase power consumption for the component to a requested consumption value,
    identify the first and second characteristic power consumption values,
    determine a maximum allowable power consumption for the component based at least on the first and second characteristic power consumption values, and the at least one property associated with the battery, and
    authorize the request in response to determining that the maximum allowable power consumption is greater than the requested consumption value.

9. The electronic device of claim 8, wherein the battery gauge includes a current sensor configured to measure a current, a voltage sensor configured to measure a voltage, and a temperature sensor configured to measure a temperature and wherein the processing circuitry determines the maximum allowable power consumption for the component based at least on the first and second characteristic power consumption values and the current, the voltage, and the temperature.

10. The electronic device of claim 8, wherein each time interval in the first set of time intervals has a first length of time, each time interval in the second set of time intervals has a second length of time, and the request to increase power consumption includes a third length of time that is different than the first and second lengths of time.

11. The electronic device of claim 10, wherein the first length of time is between 8 and 12 times longer than the second length of time and the second length of time is between 8 and 12 times longer than the third length of time.

12. The electronic device of claim 8, wherein the component exhibits an average power consumption value at each time interval in the first set of time intervals, the first characteristic power consumption value is based on a maximum of the average power consumption values across the first set of time intervals, the component exhibits an average power consumption value at each time interval in the second set of time intervals, and the second characteristic power consumption value is based on a maximum of the average power consumption values across the second set of time intervals.

13. An electronic device comprising:
    a battery;
    a battery gauge that measures at least one property associated with the battery;
    a component that requires power to operate and exhibits power consumption values over a time period; and
    processing circuitry configured to:
        identify a characteristic base power value for the component based at least on a maximum of first average values of the power consumption values, each first average value being averaged over a first length of time,
        identify a characteristic pulse power value for the component based at least on a maximum of second average values of the power consumption values, each second average value being averaged over a second length of time that is shorter than the first length of time,
        determine a maximum allowable spike power for the component based at least on the characteristic base power value and the characteristic pulse power value, and
        authorize a request from the component for a requested power consumption level in response to determining that the maximum allowable spike power is greater than the requested power consumption level.

14. The electronic device of claim 13, wherein the battery has a cut-off voltage and wherein the processing circuitry is configured to determine the maximum allowable spike power for the component based at least on the characteristic base power value, the characteristic pulse power value, a third length of time that is shorter than the second length of time, the cut-off voltage, and the at least one property associated with the battery.

* * * * *